United States Patent [19]

Babanezhad et al.

[11] Patent Number: 4,975,701
[45] Date of Patent: Dec. 4, 1990

[54] EXPONENTIAL GAIN CONTROL FOR NONLINEAR ANALOG-TO-DIGITAL CONVERTER

[75] Inventors: Joseph N. Babanezhad, Campbell; Roubik Gregorian, San Jose, both of Calif.

[73] Assignee: Sierra Semiconductor, San Jose, Calif.

[21] Appl. No.: 438,797

[22] Filed: Nov. 20, 1989

[51] Int. Cl.$^5$ .............................................. H03M 1/34
[52] U.S. Cl. .................................... 341/139; 341/138; 341/158
[58] Field of Search ............... 341/118, 122, 126, 138, 341/139, 140, 144, 158, 165, 172

[56] References Cited

U.S. PATENT DOCUMENTS 3,651,515  3/1972  Carbrey ................................. 341/138
4,769,628  9/1988  Hellerman ............................ 341/162

Primary Examiner—William M. Shoop, Jr.
Assistant Examiner—Brian K. Young
Attorney, Agent, or Firm—N. Kallman

[57] ABSTRACT

An exponential analog-to-digital converter comprises two gain stages, each of which includes a binary-weighted capacitor array. The capacitors are switched in succession to multiply the gain of a sampled analog input signal, while a counter counts down for each switching step from an initial setting of binary 111. When the gain signal has a value outside a predetermined reference voltage range, a 3-bit binary digital word representative of the analog input signal sample is registered in the counter. If the gain signal produced after all the capacitors have been switched in to provide the maximum gain does not fall outside the reference range, then the binary word stored in the counter for the sample of the analog signal is 000.

13 Claims, 2 Drawing Sheets

EXPONENTIAL GAIN CONTROL FOR NONLINEAR ANALOG-TO-DIGITAL CONVERTER

FIELD OF THE INVENTION

This invention relates to an analog-to-digital converter (ADC) and in particular to an exponential nonlinear ADC.

BACKGROUND OF THE INVENTION

Description of the Prior Art

An analog signal can be converted to and be represented by digital words consisting of a number of binary digits. Data processing systems generally incorporate an ADC for converting an analog signal to a binary or digital representation. Each value of input voltage generates a specific binary output of 1s and 0s. During the process of conversion, the ADC samples the analog signal periodically and generates a digital output that corresponds to the analog signal. The sampling frequency is much higher than the frequency of the analog signal and the sampling times are close enough whereby several samples are obtained for each cycle of the analog signal.

There are several ADC implementations, such as the counter type having up-down counting ability, the successive-approximation type for high speed conversion, and the dual-slope type that provides long-term accuracy, by way of example.

SUMMARY OF THE INVENTION

An object of this invention is to provide a wide analog input voltage with few output digital bits, wherein the ADC adopts an exponential input-to-output characteristic.

In accordance with this invention, a modified form of a successive-approximation type ADC comprises an exponential gain control that incorporates two gain stages, each stage including a binary-weighted capacitor array. Each array is coupled between the output and the inverting input of a respective operational amplifier (op amp). A voltage comparator circuit comprising differential amplifiers is coupled to the output of the second gain stage to receive and compare the output voltage of the second gain stage to positive and negative reference voltages. A logic circuit responsive to the comparator output provides a logic signal to a digital output counter which can store 3-bit words representative of successive samples of the analog input voltage. This circuit also provides clock signals to establish the sampling periods and control the sequence of modes of operation of the ADC.

During operation of the ADC, the output counter is initially loaded with all binary ones. Both gain stages are connected in unity gain while the first capacitor array samples the analog input voltage and the second capacitor array samples ground. A voltage comparator circuit compares the output of the second gain stage with positive and negative reference voltages.

If the output voltage of the second gain stage is less than the negative reference voltage or greater than the positive reference voltage, the conversion process stops and a 3-bit binary word representation of the instant analog signal sample is determined. The ADC is then reset to process the next sample of the analog input voltage. On the other hand, if the output voltage of the second gain stage is in the range between the positive and negative reference voltages, the largest capacitor of the first capacitor array is connected between the inverting input of the first op amp and ground, thereby multiplying the input voltage by a factor of 2. The output counter counts down by one to 110 while the voltage comparator circuit compares the output voltage of the second gain stage against the positive and negative reference voltages. The conversion process continues by successively connecting, in descending order of binary weight, the feedback capacitors of the first array to ground thereby multiplying the previous output voltage of the first gain stage by two. Each time that the multiplied output voltage of the second stage is compared with the positive and negative reference voltages of the comparator circuit and the output voltage is in the range between the reference voltages, the output counter counts down by one. The capacitors of the first array are successively connected to ground and if the output voltage that is being compared is not outside the voltage range defined by the reference voltages, the capacitors of the second capacitor array which were connected in the feedback path of its op amp are then successively connected to ground. The conversion stops when either the output voltage of the second gain stage exceeds the range between the positive and negative reference voltages and a 3-bit binary word indicative of the instant sample or slice of the analog input signal is generated; or if the contents of the output counter becomes all binary zeros. The analog-to-digital conversion process is then continued by resetting the counter and preparing the ADC circuitry to process subsequent samples of the analog input signal.

BRIEF DESCRIPTION OF THE DRAWINGS

The invention will be described with reference to the drawing in which.

DESCRIPTION OF THE PREFERRED EMBODIMENT

Figure 1:
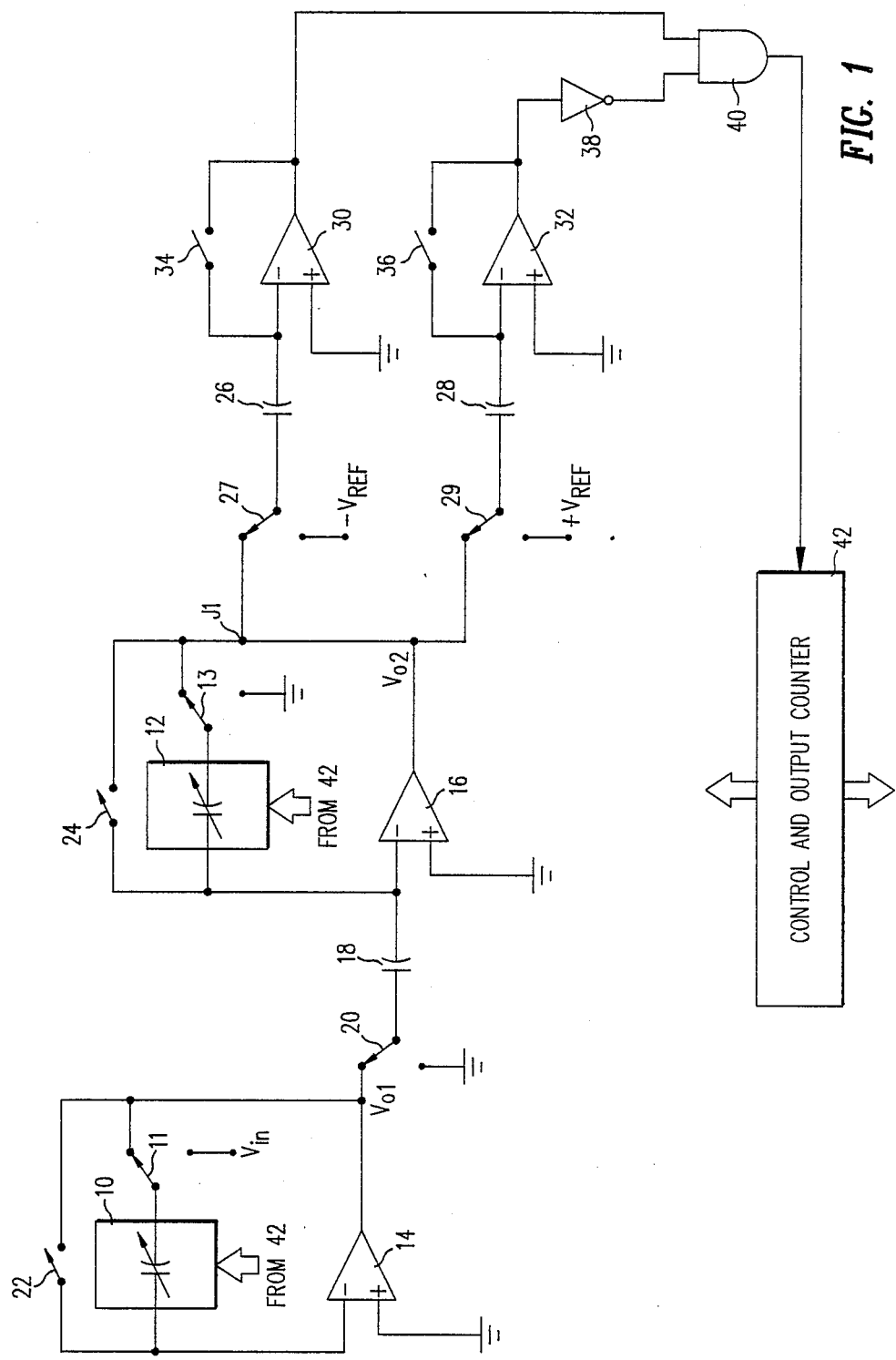
FIG. 1 is a schematic and block diagram of the exponential gain ADC of this invention.

With reference to FIG. 1, an exponential ADC comprises a first gain stage including a capacitor array 10 and a second gain stage including a capacitor array 12 which is coupled to the output of the first capacitor array through a switch 20 and a capacitor 18. Each gain stage includes an op amp 14 and 16 respectively, with the inverting input of the op amp disposed in a feedback path with its respective capacitor array. Reset switches 22 and 24 are coupled across the arrays 10 and 12 and sampling switches 11 and 13 are provided for sampling the analog input voltages and ground potential respectively by arrays 10 and 12.

A voltage comparator circuit is coupled to the output of the second stage to receive an analog output voltage $V_{o2}$ that appears at junction J1 and which represents the analog input signal being sampled. The comparator circuit is an offset-cancelled comparator which consists of differential amplifiers 30 and 32 having their inverted inputs coupled to junction J1 through switches 27, 29 and capacitors 26 and 28 respectively. Switches 34 and 36 are connected between the inverting input and the output of the respective amplifiers 30 and 32. An AND logic gate 40 is connected to the output of amplifier 30 and coupled to the output of amplifier 32 through an inverter 38. The ANDed signal output of gate 40 is provided to a control and output counter 42 for storing 3-bit digital words representing the sampled analog input voltage. The words are registered for each sample whenever the output voltage from the second gain stage exceeds the range delineated by the reference voltages. However, if the sampled output voltage which is successively multiplied by the two gain stages does not exceed the reference voltage range, then the counter 42 counts down by one for each comparison of the analog voltage until the counter registers the digital word 000. After the conversion of each analog voltage sample to a 3-bit digital word, the exponential ADC is reset to begin the next iteration of the conversion process for the succeeding analog voltage sample which is provided periodically under control of a timing signal from the counter 42.

At the start of operation of the exponential ADC during which the analog input voltage is sampled, reset switches 22 and 24 which are connected respectively across the arrays 10 and 12 are closed. Switch 11 is connected to the source of the analog input voltage signal and switch 13 is connected to ground. Switch 20 is connected to GND (ground) and switches 29 and 27 are connected to the positive reference voltage ($+V_{ref}$) and negative reference voltage ($-V_{ref}$) respectively. Switches 34 and 36 are closed in the sampling mode. The analog input voltage is sampled across the first capacitor array 10 while the second capacitor array 12 samples ground. Next switches 32 and 34 open and switches 27 and 29 are connected to J1. If the voltage appearing at the junction J1 at the output of the second stage is greater than either reference voltage, i.e., outside the range defined by the reference voltages, then the AND gate 40 output goes False or low. In such case, the control counter 42 stops the conversion operation and the counter stores the 3-bit word which exists in the counter register which comprises three flip-flops. However, if the voltage at junction J1 is within the range between the reference voltages, the output of AND gate 40 is True or high. In this event, the counter 42 counts down by one. The counter 42 is initially set at 111 and successively counts down until the AND gate 40 output is False or until the counter 42 reaches 000.

The voltage comparator circuit comprising differential amplifiers 30 and 32 compares the output voltage $V_o2$ from the second gain stage at junction J1 with the positive and negative reference voltages. If the output voltage of the second stage is more negative than the negative reference voltage or more positive than the positive reference voltage, the conversion is stopped.

Figure 2:
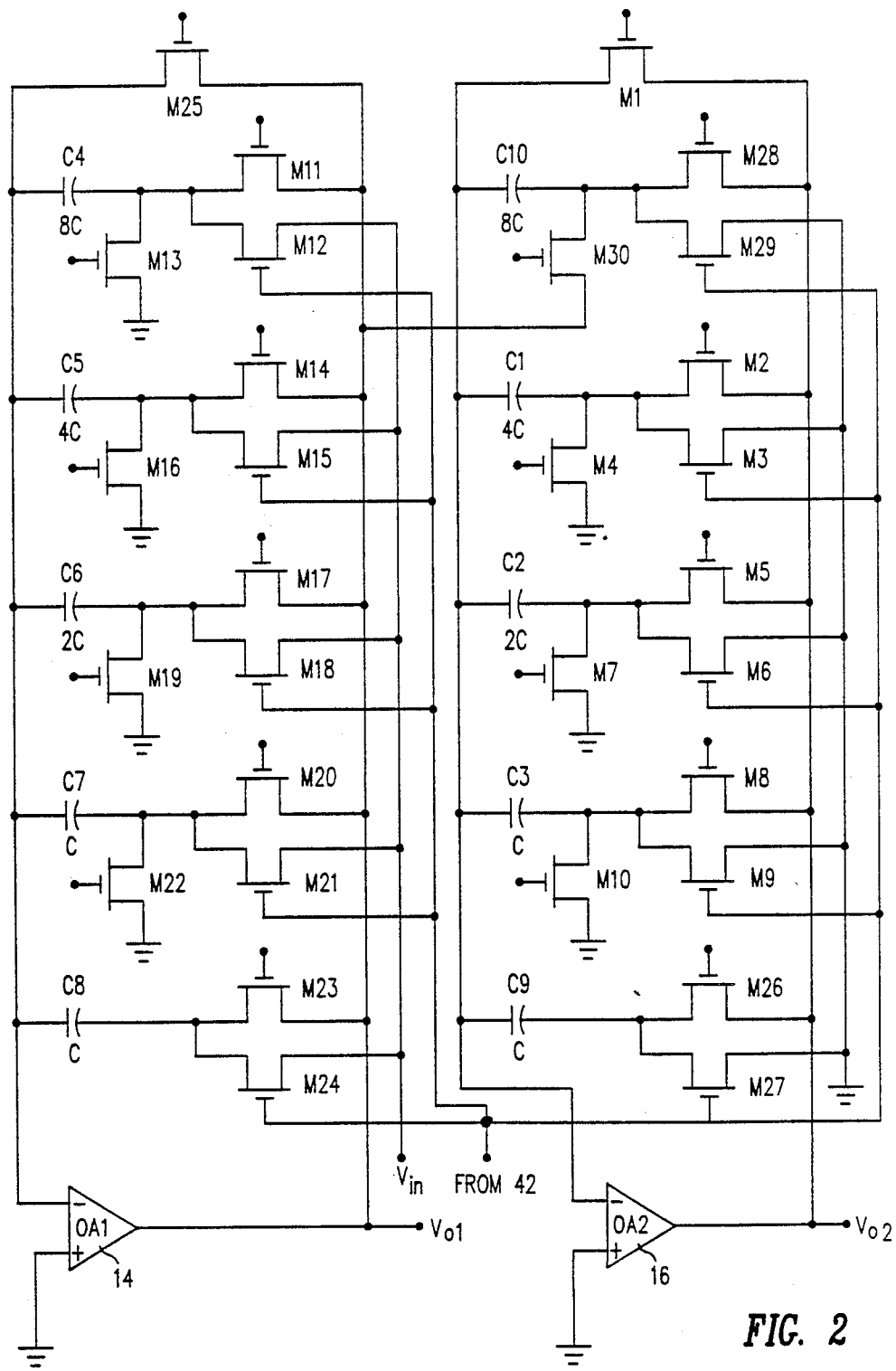
FIG. 2 is a schematic circuit diagram delineating the two capacitor arrays used in the implementation of FIG. 1.

On the other hand, if the output voltage Vo2 is in the range between the reference voltages, then the first capacitor C4 of the array 10, shown in FIG. 2, is connected between ground and the inverting input of the first op amp 14, thus multiplying the input voltage by two. The counter 42 counts down by one and the voltage comparator circuit compares the multiplied analog output voltage at junction J1 with the reference voltages. If the multiplied analog voltage at junction J1 does not exceed the range set by the reference voltages, the next largest capacitor C5 is connected between ground and the inverting input of the op amp 14, and the counter 42 counts down by one. Each time that the output signal from AND gate 40 is True, the counter 42 counts down by one. In such case, the capacitor C6, and then C7 if the gate 40 output is True, of the first array 10 are successively connected between ground and the inverting input of op amp 14. However capacitor C8 is not connected to ground to ensure that feedback is provided between the output and inverting input of op amp 14.

The comparator circuit output is fed to the AND gate 40 and the ANDed signal is provided to the output counter 42 which will count down by one for each comparison if the analog output voltage is in the range between the reference voltages. In those cases where the output voltage is outside the reference voltage range, the down counter 42 does not change and stores the 3-bit word representing the sampled analog voltage.

As the counter 42 counts down, the 3-bit output digital words change from the initial setting of binary 111; to 110 for a gain of 2; to 101 for a gain of 4; to 100 for a gain of 8; and to 011 for a gain of 16 which can be provided by the first gain stage. In the first gain stage, capacitor C4 has a binary weight of 8, C5 a binary weight of 4, C6 a binary weight of 2, and C7 and C8 each have a binary weight of 1.

In the event that the total gain provided by the capacitors of the first stage does not produce an analog output voltage beyond the reference voltage range, then the capacitors C10, C1, C2 and C3 of the second gain stage are successively connected between ground and the inverting input of the op amp 16. As the counter 42 counts down during operation of the second gain stage, the 3-bit output digital words change successively to 010 for a gain of 32; to 001 for a gain of 64; and to 000 for a gain of 128 which are provided by capacitors C10, C1, C2 and C3 of the second gain stage. In the second gain stage, C10 has a binary weight of 8, C1 a binary weight of 4, C2 a binary weight of 2 and C3 and C9 each have a binary weight of 1.

The exponential ADC of this invention operates in three modes, first the sampling mode, then the unity gain feedback mode and finally the gain ranging mode. These modes occur in sequence during the processing of each sample of the analog voltage that is to be converted to digital form. The following table illustrates the state of the transistor switches for each of these modes of operation:

| SWITCH | SAMPLING | UNITY-GAIN FEEDBACK | GAIN-RANGING |
|---|---|---|---|
| R | closed | open | open |
| G | open | open | open/closed |
| C | open | open | closed |
| F | open | closed | closed/open |
| S | closed | open* | open | where R represents the reset switches M1 and M25; G represents the grounding switches M13, M16, M19, M22, M4, M7 and M10; C is the coupling switch M30; F represents feedback switches M11, M14, M17, M20, M23, M28, M2, M5, M8 and M26; and S represents the sampling switches M12, M15, M18, M21, M24, M29, M3, M6, M9 and M27.

At the start, the reset switches first close, the sampling switches close and the feedback switches open. During operation in the first mode, which is a sampling mode, the input analog voltage $V_{in}$ is sampled by the first capacitor array 10 while the second capacitor array 12 samples ground. Reset transistors M25 of the first array 10 and M1 of the second array 12 are switched to be closed. Grounding switch transistors M13, M16 and M19 and M22 of the first array 10 and M4, M7, M10 and M30 of the second array 12 are open. Feedback transistors M11, M14, M17, M20 and M23 of the first capacitor array and M28, M2, M5, M8 and M26 of the second capacitor array are open and nonconducting. The input voltage is sampled by transistors M12, M15, M18, M21 and M24 of the first capacitor array.

The voltage comparator circuit is coupled to the output of the second gain stage at junction J1 through the switches 29 and 27 and capacitors 26 and 28. When switches 29 and 27 are toggled to receive the positive and negative reference voltages, the op amps 30 and 32 compare the analog voltage to the reference voltages and produce a high or low signal depending upon the amplitude of the analog voltage. The voltage signal from op amp 32 is inverted in an inverter 38 and directed to an AND logic gate 40 in conjunction with the signal from the op amp 30. In the event that both inputs to the AND gate are high, then a True output pulse is provided to the down counter 42. If the analog voltage is in the range between the reference voltages, the pulse from the AND gate 40 makes the counter count down by 1 so that the contents of the counter becomes 110. At this time, the largest capacitor C4 in the first gain stage which was connected to the feedback circuit through the M11 switching transistor now connects to ground through the closed grounding switch transistor M13 and the first gain stage becomes a gain 2 amplifier. The input analog voltage is doubled and thus the analog voltage sample at junction J1 is also doubled. If the multiplied voltage exceeds the range between the positive reference voltage and the negative reference voltage, then the conversion process is stopped and the digital representation in the counter becomes 110 representing the sampled analog voltage. However if the doubled voltage is not outside the range, but between the two reference voltages, then the gain is again doubled by opening switch M14 and connecting capacitor C5 which has a binary weight of 4 to GND through switch M16. If at this time the sampled voltage still is in the range between the reference voltages, then the next largest capacitor C6 of the first gain stage is grounded to double the gain.

The conversion process continues by connecting successively the feedback capacitors in descending order of binary weight in the first array to ground, thereby multiplying the previous analog output voltage of the second gain stage by 2. The multiplied output voltage of the second gain stage is compared with the reference voltages in the voltage comparator circuit. The output counter 42 counts down by one during each successive approximation cycle whenever the multiplied analog voltage sample does not fall outside the reference voltage range. Each sampled value of analog input voltage generates a specific 3-bit binary output of 1s and 0s.

The exponential ADC disclosed herein is capable of processing wider ranges of analog input voltages than the prior art linear type ADC. The 3-bit exponential ADC can handle analog voltages that have a 128:1 range. For the same range of analog input voltages, a linear ADC would require a 7-bit analog-to-digital converter circuit configuration.

We claim:

1. An exponential analog-to-digital converter comprising:
   means for providing an analog input signal;
   a first gain stage coupled to said analog signal providing means, a second gain stage coupled to said first stage;
   means for sampling said input signal, each stage providing means for increasing the gain of a sampled signal in a series of steps to provide an analog output signal;
   voltage comparator means coupled to said gain stages for comparing the analog output signal for each gain increase, including a logic circuit for producing a logic signal indicative of the magnitude of the analog output signal; and
   a counter coupled to said logic network for registering a binary word representative of the sampled analog signal.

2. An exponential analog-to-digital converter as in claim 1, wherein said first and second gain stages comprise respectively first and second capacitor arrays including binary-weighted capacitors.

3. An exponential analog-to-digital converter as in claim 2, including sampling switch means coupled between said input signal providing means and said capacitors.

4. An exponential analog-to-digital converter as in claim 2, including means for switching the binary-weighted capacitors in succession for sampling the analog input voltage.

5. An exponential analog-to-digital converter as in claim 2, wherein said first and second gain stages include first and second operational amplifiers respectively, each amplifier having an inverting input coupled to its capacitor array.

6. An exponential analog-to-digital converter as in claim 4, wherein said gain stages include feedback switches coupled between the output of said operational amplifiers and said capacitors.

7. An exponential analog-to-digital converter as in claim 2, including switch means for connecting said first and second gain stages.

8. An exponential analog-to-digital converter as in claim 1, including means coupled between said second gain stage and said voltage comparator means for providing positive and negative reference voltages which define a reference voltage range.

9. An exponential analog-to-digital converter as in claim 1, wherein said voltage comparator means comprises a pair of operational amplifiers coupled between said reference voltage providing means and said logic circuit, capacitive means coupled to the inverting inputs of said pair of operational amplifiers, and switch means coupled between said second stage and said capacitive means for sampling the reference voltages.

10. An exponential analog-to-digital converter as in claim 1, wherein said counter is a down counter and counts down from an initial 3-bit digital word of 111.

11. An exponential analog-to-digital converter as in claim 1, wherein said comparator means comprises an offset-cancelled comparator circuit.

12. An exponential analog-to-digital converter as in claim 1, wherein said counter comprises means for providing timing signals to said converter to control the switching functions of said converter.

13. An exponential analog-to-digital converter as in claim 1, wherein said gain stages include reset switches for resetting said capacitor arrays after conversion has stopped.

* * * * *